United States Patent
Jin et al.

(10) Patent No.: US 9,166,279 B2
(45) Date of Patent: Oct. 20, 2015

(54) TUNABLE ANTENNA SYSTEM WITH RECEIVER DIVERSITY

(75) Inventors: Nanbo Jin, Sunnyvale, CA (US); Mattia Pascolini, San Mateo, CA (US); Matt A. Mow, Los Altos, CA (US); Robert W. Schlub, Cupertino, CA (US); Ruben Caballero, San Jose, CA (US)

(73) Assignee: Apple Inc., Cupertino, CA (US)

(*) Notice: Subject to any disclaimer, the term of this patent is extended or adjusted under 35 U.S.C. 154(b) by 1190 days.

(21) Appl. No.: 13/041,905

(22) Filed: Mar. 7, 2011

(65) Prior Publication Data
US 2012/0229347 A1 Sep. 13, 2012

(51) Int. Cl.
| | | |
|---|---|---|
| H04M 1/00 | (2006.01) | |
| H01Q 5/01 | (2006.01) | |
| H01Q 1/24 | (2006.01) | |
| H01Q 7/00 | (2006.01) | |
| H01Q 9/14 | (2006.01) | |
| H01Q 9/42 | (2006.01) | |
| H01Q 21/28 | (2006.01) | |
| H01Q 1/44 | (2006.01) | |
| H01Q 5/307 | (2015.01) | |

(52) U.S. Cl.
CPC .............. *H01Q 1/243* (2013.01); *H01Q 1/44* (2013.01); *H01Q 5/307* (2015.01); *H01Q 7/00* (2013.01); *H01Q 9/14* (2013.01); *H01Q 9/42* (2013.01); *H01Q 21/28* (2013.01)

(58) Field of Classification Search
USPC ................................. 455/575.7; 343/702, 745
See application file for complete search history.

(56) References Cited

U.S. PATENT DOCUMENTS

| | | |
|---|---|---|
| 2,324,462 A | 7/1943 | Leeds et al. |
| 2,942,263 A | 6/1960 | Baldwin |

(Continued)

FOREIGN PATENT DOCUMENTS

| | | |
|---|---|---|
| CN | 1745500 | 3/2006 |
| CN | 101002361 | 7/2007 |

(Continued)

OTHER PUBLICATIONS

Pascolini et al., U.S. Appl. No. 12/630,756, filed Dec. 3, 2009.

(Continued)

*Primary Examiner* — Jinsong Hu
*Assistant Examiner* — Jean Chang
(74) *Attorney, Agent, or Firm* — Treyz Law Group; G. Victor Treyz; Michael H. Lyons

(57) ABSTRACT

A wireless electronic device may include antenna structures and antenna tuning circuitry. The device may include a display mounted within a housing. A peripheral conductive member may run around the edges of the display and housing. Dielectric-filled gaps may divide the peripheral conductive member into individual segments. A ground plane may be formed within the housing. The ground plane and the segments of the peripheral conductive member may form antennas in upper and lower portions of the housing. The antenna tuning circuitry may include switchable inductor circuits and variable capacitor circuits for the upper and lower antennas. The switchable inductor circuits associated with the upper antenna may be tuned to provide coverage in at least two high-band frequency ranges of interest, whereas the variable capacitor circuits associated with the upper antenna may be tuned to provide coverage in at least two low-band frequency ranges of interest.

22 Claims, 9 Drawing Sheets

(56) References Cited

U.S. PATENT DOCUMENTS

| | | | |
|---|---|---|---|
| 3,394,373 A | 7/1968 | Makrancy |
| 3,736,591 A | 5/1973 | Rennels et al. |
| 4,123,756 A | 10/1978 | Nagata et al. |
| 4,518,965 A | 5/1985 | Hidaka |
| 4,617,571 A | 10/1986 | Choquer et al. |
| 4,879,755 A | 11/1989 | Stolarczyk et al. |
| 4,893,131 A | 1/1990 | Smith et al. |
| 4,894,663 A | 1/1990 | Urbish |
| 4,980,694 A | 12/1990 | Hines |
| 5,021,010 A | 6/1991 | Wright |
| 5,041,838 A | 8/1991 | Liimatainen |
| 5,048,118 A | 9/1991 | Brooks |
| 5,061,943 A | 10/1991 | Rammos |
| 5,105,396 A | 4/1992 | Ganter et al. |
| 5,159,707 A | 10/1992 | Mogi et al. |
| 5,381,387 A | 1/1995 | Blonder et al. |
| 5,408,241 A | 4/1995 | Shattuck |
| 5,465,098 A | 11/1995 | Fujisawa et al. |
| 5,473,252 A | 12/1995 | Renz et al. |
| 5,561,437 A | 10/1996 | Phillips |
| 5,585,810 A | 12/1996 | Tsuru et al. |
| 5,627,552 A | 5/1997 | Farrar et al. |
| 5,754,143 A | 5/1998 | Warnagiris |
| 5,768,691 A | 6/1998 | Matero et al. |
| 5,798,984 A | 8/1998 | Koch |
| 5,812,066 A | 9/1998 | Terk et al. |
| 6,011,699 A | 1/2000 | Murray |
| 6,014,113 A | 1/2000 | Orchard et al. |
| 6,021,317 A | 2/2000 | Irvin |
| 6,097,345 A | 8/2000 | Walton |
| 6,269,054 B1 | 7/2001 | Truini |
| 6,282,433 B1 | 8/2001 | Holshouser |
| 6,337,662 B1 | 1/2002 | Cassel |
| 6,339,400 B1 | 1/2002 | Flint et al. |
| 6,518,929 B1 | 2/2003 | Gilmore |
| 6,560,443 B1 | 5/2003 | Vaisaneri et al. |
| 6,606,063 B1 | 8/2003 | Merenda |
| 6,622,031 B1 | 9/2003 | McCleary |
| 6,670,923 B1 | 12/2003 | Kadambi et al. |
| 6,741,214 B1 | 5/2004 | Kadambi et al. |
| 6,747,601 B2 | 6/2004 | Boyle |
| 6,762,723 B2 | 7/2004 | Nallo |
| 6,812,898 B2 | 11/2004 | Doub et al. |
| 6,853,605 B2 | 2/2005 | Fujisawa et al. |
| 6,856,294 B2 | 2/2005 | Kadambi et al. |
| 6,885,880 B1 | 4/2005 | Ali |
| 6,894,647 B2 | 5/2005 | Jenwatenavel |
| 6,933,897 B2 | 8/2005 | Asano et al. |
| 6,968,508 B2 | 11/2005 | Lucaci |
| 6,980,154 B2 | 12/2005 | Vance et al. |
| 7,027,838 B2 | 4/2006 | Zhou et al. |
| 7,035,170 B2 | 4/2006 | Narayanaswami et al. |
| 7,084,814 B2 | 8/2006 | Chen et al. |
| 7,116,267 B2 | 10/2006 | Schuster et al. |
| 7,119,747 B2 | 10/2006 | Lin et al. |
| 7,123,208 B2 | 10/2006 | Baliarda et al. |
| 7,132,987 B1 | 11/2006 | Olsson et al. |
| 7,155,178 B2 | 12/2006 | Chang et al. |
| 7,164,387 B2 | 1/2007 | Sievenpiper |
| 7,167,090 B1 | 1/2007 | Mandal et al. |
| 7,176,842 B2 | 2/2007 | Bettren et al. |
| 7,212,161 B2 | 5/2007 | Chen et al. |
| 7,215,283 B2 | 5/2007 | Boyle |
| 7,215,600 B1 | 5/2007 | DeRosa |
| 7,239,889 B2 | 7/2007 | Saari et al. |
| 7,250,910 B2 | 7/2007 | Yoshikawa et al. |
| 7,260,424 B2 | 8/2007 | Schmidt |
| 7,271,769 B2 | 9/2007 | Asano et al. |
| 7,340,286 B2 | 3/2008 | Korva et al. |
| 7,348,928 B2 * | 3/2008 | Ma et al. ............ 343/770 |
| 7,372,406 B2 | 5/2008 | Shiotsu et al. |
| 7,408,517 B1 | 8/2008 | Poilasne et al. |
| 7,420,511 B2 | 9/2008 | Oshiyama et al. |
| 7,551,142 B1 | 6/2009 | Zhang et al. |
| 7,595,759 B2 | 9/2009 | Schlub et al. |
| 7,612,725 B2 | 11/2009 | Hill et al. |
| 7,619,574 B1 | 11/2009 | West |
| 7,623,079 B2 | 11/2009 | Hayashi |
| 7,652,629 B2 | 1/2010 | Teshima |
| 7,671,693 B2 | 3/2010 | Brobston et al. |
| 7,671,804 B2 | 3/2010 | Zhang et al. |
| 7,696,932 B2 | 4/2010 | Desclos et al. |
| 7,714,790 B1 | 5/2010 | Feldstein et al. |
| 7,768,461 B2 | 8/2010 | Cheng et al. |
| 7,768,462 B2 | 8/2010 | Zhang et al. |
| 7,768,468 B2 | 8/2010 | Gustafson et al. |
| 7,869,830 B2 | 1/2011 | Hartenstein et al. |
| 7,876,274 B2 | 1/2011 | Hobson et al. |
| 7,884,769 B2 | 2/2011 | Boyle |
| 7,889,139 B2 | 2/2011 | Hobson et al. |
| 7,936,307 B2 | 5/2011 | Pang et al. |
| 8,009,110 B2 | 8/2011 | Teng et al. |
| 8,040,656 B2 | 10/2011 | Park et al. |
| 8,054,240 B2 | 11/2011 | Honda |
| 8,102,319 B2 | 1/2012 | Schlub et al. |
| 8,106,836 B2 | 1/2012 | Hill et al. |
| 8,169,373 B2 | 5/2012 | Schlub et al. |
| 8,227,700 B2 | 7/2012 | Kim |
| 8,665,164 B2 | 3/2014 | Hill et al. |
| 2001/0043514 A1 | 11/2001 | Kita |
| 2002/0126236 A1 | 9/2002 | Hiratsuka et al. |
| 2003/0107518 A1 | 6/2003 | Li et al. |
| 2003/0117900 A1 | 6/2003 | Fujisawa et al. |
| 2004/0008146 A1 | 1/2004 | Ikegaya et al. |
| 2004/0017318 A1 | 1/2004 | Annabi et al. |
| 2004/0041734 A1 | 3/2004 | Shiotsu et al. |
| 2004/0056808 A1 | 3/2004 | Jenwatanavet |
| 2004/0090377 A1 | 5/2004 | Dai et al. |
| 2004/0116157 A1 | 6/2004 | Vance et al. |
| 2004/0145521 A1 | 7/2004 | Hebron et al. |
| 2004/0207559 A1 | 10/2004 | Milosavljevic |
| 2004/0222926 A1 | 11/2004 | Kontogeorgakis et al. |
| 2004/0227678 A1 | 11/2004 | Sievenpiper |
| 2004/0257283 A1 | 12/2004 | Asano et al. |
| 2004/0263411 A1 | 12/2004 | Fabrega-Sanchez et al. |
| 2005/0073462 A1 | 4/2005 | Lin et al. |
| 2005/0085204 A1 * | 4/2005 | Poilasne et al. ............ 455/193.1 |
| 2006/0055606 A1 * | 3/2006 | Boyle .......................... 343/702 |
| 2006/0097941 A1 | 5/2006 | Bettren et al. |
| 2006/0114159 A1 | 6/2006 | Yoshikawa et al. |
| 2006/0125703 A1 | 6/2006 | Ma et al. |
| 2007/0146218 A1 | 6/2007 | Turner et al. |
| 2007/0149145 A1 | 6/2007 | Chang et al. |
| 2007/0176843 A1 | 8/2007 | Qureshi et al. |
| 2007/0182658 A1 | 8/2007 | Ozden |
| 2007/0200766 A1 | 8/2007 | McKinzie et al. |
| 2007/0216590 A1 * | 9/2007 | Montgomery et al. ....... 343/745 |
| 2007/0218853 A1 | 9/2007 | Yu |
| 2007/0222697 A1 | 9/2007 | Caimi et al. |
| 2007/0224948 A1 | 9/2007 | Hartenstein et al. |
| 2007/0229376 A1 | 10/2007 | Desclos et al. |
| 2007/0268191 A1 | 11/2007 | Ishizuka et al. |
| 2008/0081581 A1 | 4/2008 | Rofougaran |
| 2008/0100514 A1 | 5/2008 | Abdul-Gaffoor et al. |
| 2008/0143613 A1 | 6/2008 | Iwai et al. |
| 2008/0150811 A1 | 6/2008 | Honda et al. |
| 2008/0218291 A1 | 9/2008 | Zhu et al. |
| 2008/0266199 A1 | 10/2008 | Milosavljevic et al. |
| 2008/0316115 A1 | 12/2008 | Hill et al. |
| 2009/0051604 A1 | 2/2009 | Zhang et al. |
| 2009/0081963 A1 | 3/2009 | Boren |
| 2009/0128428 A1 | 5/2009 | Ishizuka et al. |
| 2009/0153407 A1 | 6/2009 | Zhang et al. |
| 2009/0153412 A1 | 6/2009 | Chiang et al. |
| 2009/0179811 A1 | 7/2009 | Chou |
| 2009/0180403 A1 | 7/2009 | Tudosoiu |
| 2009/0185325 A1 | 7/2009 | Park et al. |
| 2009/0256758 A1 | 10/2009 | Schlub et al. |
| 2009/0256759 A1 | 10/2009 | Hill et al. |
| 2010/0022203 A1 | 1/2010 | Bonnet et al. |
| 2010/0053002 A1 | 3/2010 | Wojack et al. |
| 2010/0060421 A1 | 3/2010 | Chang et al. |
| 2010/0060529 A1 | 3/2010 | Schlub et al. |
| 2010/0109968 A1 * | 5/2010 | Suzuki et al. ................. 343/876 |

(56) References Cited

U.S. PATENT DOCUMENTS

| | | | |
|---|---|---|---|
| 2010/0123632 A1 | 5/2010 | Hill et al. | |
| 2010/0149052 A1* | 6/2010 | Nishio et al. | 343/702 |
| 2010/0214180 A1* | 8/2010 | Krogerus | 343/702 |
| 2010/0231481 A1 | 9/2010 | Chiang et al. | |
| 2010/0271271 A1 | 10/2010 | Wu | |
| 2011/0006953 A1* | 1/2011 | Chiang et al. | 343/702 |
| 2011/0063779 A1 | 3/2011 | Ochi et al. | |
| 2011/0136447 A1 | 6/2011 | Pascolini et al. | |
| 2011/0183633 A1 | 7/2011 | Ohba et al. | |
| 2012/0098720 A1 | 4/2012 | Hill et al. | |
| 2012/0112970 A1 | 5/2012 | Caballero et al. | |
| 2012/0115553 A1 | 5/2012 | Mahe et al. | |
| 2012/0162033 A1 | 6/2012 | Togashi | |
| 2012/0231750 A1 | 9/2012 | Jin et al. | |
| 2012/0245201 A1 | 9/2012 | Markowitz et al. | |
| 2013/0009828 A1 | 1/2013 | Pascolini et al. | |
| 2013/0169490 A1 | 7/2013 | Pascolini et al. | |
| 2013/0229322 A1 | 9/2013 | Wang | |

FOREIGN PATENT DOCUMENTS

| | | |
|---|---|---|
| CN | 101496224 | 7/2009 |
| CN | 101540620 | 9/2009 |
| CN | 101682119 | 3/2010 |
| CN | 201533015 | 7/2010 |
| CN | 101814649 | 8/2010 |
| CN | 101911379 | 12/2010 |
| CN | 202025842 | 11/2011 |
| DE | 20314836 | 11/2003 |
| DE | 10353104 | 6/2005 |
| EP | 0741433 | 11/1996 |
| EP | 1093098 | 4/2001 |
| EP | 1280230 | 1/2003 |
| EP | 1286413 | 2/2003 |
| EP | 1315238 | 5/2003 |
| EP | 1401050 | 3/2004 |
| EP | 1753082 | 4/2005 |
| EP | 1553658 | 7/2005 |
| EP | 1557903 | 7/2005 |
| EP | 1594188 | 11/2005 |
| EP | 1686651 A2 | 8/2006 |
| EP | 1995889 | 11/2008 |
| EP | 2048739 | 4/2009 |
| EP | 2161785 | 3/2010 |
| EP | 2219265 | 8/2010 |
| EP | 2219615 | 8/2010 |
| EP | 2405334 | 1/2012 |
| GB | 921950 | 3/1963 |
| GB | 0944039 | 12/1963 |
| GB | 2384367 | 7/2003 |
| JP | 3-502269 | 5/1991 |
| JP | 09-093029 | 4/1997 |
| JP | 09-307344 | 11/1997 |
| JP | 2001136019 | 5/2001 |
| JP | 2001185927 | 7/2001 |
| JP | 2004-48119 | 2/2004 |
| JP | 2006180077 | 7/2006 |
| JP | 2009049455 | 3/2009 |
| JP | 2010147636 | 7/2010 |
| JP | 2010536246 | 11/2010 |
| KR | 1986000331 | 4/1986 |
| KR | 2004108759 | 12/2004 |
| KR | 10-2005-0098880 | 10/2005 |
| TW | 310084 | 7/1997 |
| TW | 200929687 | 7/2009 |
| WO | 8905530 | 6/1989 |
| WO | 0159945 | 8/2001 |
| WO | 02078123 | 10/2002 |
| WO | 03096474 | 11/2003 |
| WO | 04001894 | 12/2003 |
| WO | 2004102744 | 11/2004 |
| WO | 2005032130 | 4/2005 |
| WO | 2005109567 | 11/2005 |
| WO | 2006114771 | 11/2006 |
| WO | 2007012697 | 2/2007 |
| WO | 2007039667 | 4/2007 |
| WO | 2007039668 | 4/2007 |
| WO | 2008010149 | 1/2008 |
| WO | 2008013021 | 1/2008 |
| WO | 2008055039 | 5/2008 |
| WO | 2009002575 | 12/2008 |
| WO | 2009091323 | 7/2009 |
| WO | WO 2009091323 A1 * | 7/2009 |
| WO | 2009145264 | 12/2009 |
| WO | 2010025023 | 3/2010 |
| WO | 2012006152 | 1/2012 |

OTHER PUBLICATIONS

Mow et al., U.S. Appl. No. 12/831,180, filed Jul. 6, 2010.
Caballero, et al., U.S. Appl. No. 12/941,010, filed Nov. 5, 2010.
Lee et al. "A Compact and Low-Profile Tunable Loop Antenna Integrated With Inductors", IEEE Antennas and Wireless Propagation Letters, vol. 7, 2008 pp. 621-624.
Nanbo Jin et al., U.S. Appl. No. 13/041,934, filed Mar. 7, 2011.
Menzel et al., "A Microstrip Patch Antenna with Coplanar Feed Line" IEEE Microwave and Guided Wave Letters, vol. 1, No. 11, Nov. 1991, pp. 340-342.
Terada et al., "Circularly Polarized Tunable Microstrip Patch Antenna Using an Adjustable Air Gap", Proceedings of ISAP2005, Seoul, Korea pp. 977-980.
Chiang et al., U.S. Appl. No. 12/401,599, filed Apr. 13, 2013.
Jarvis et al., U.S. Appl. No. 12/823,929, filed Jun. 25, 2010.
Schlub et al., U.S. Appl. No. 12/759,243, filed Apr. 13, 2010.
Nickel et al., U.S. Appl. No. 12/752,966, filed Apr. 1, 2010.
U.S. Appl. No. 60/833,587, filed Jan. 5, 2007, Hobson et al.

* cited by examiner

| | 750 | | 850 | | 900 | | 1800 | | 1900 | | 2100 | |
|---|---|---|---|---|---|---|---|---|---|---|---|---|
| | TX | RX | TX | RX | TX | RX | TX | RX | TX | RX | TX | RX |
| LOWER | ✓ | ✓ | ✓ | ✓ | ✓ | ✓ | ✓ | ✓ | ✓ | ✓ | ✓ | ✓ |
| 250 { UPPER [$C_C$ MIN, $L_{SW}$ OFF] | | | | ✓ | | ✓ | ✓ | | ✓ | | | |
| 252 { UPPER [$C_C$ TUNE, $L_{SW}$ OFF] | | ✓ | | | | | | ✓ | | ✓ | | |
| 254 { UPPER [$C_C$ MIN, $L_{SW}$ ON] | | | | ✓ | ✓ | | | | | | | ✓ |

FIG. 10

TUNABLE ANTENNA SYSTEM WITH RECEIVER DIVERSITY

BACKGROUND

This relates generally to wireless communications circuitry, and more particularly, to electronic devices that have wireless communications circuitry.

Electronic devices such as portable computers and cellular telephones are often provided with wireless communications capabilities. For example, electronic devices may use long-range wireless communications circuitry such as cellular telephone circuitry to communicate using cellular telephone bands at 850 MHz, 900 MHz, 1800 MHz, 1900 MHz, and 2100 MHz. Electronic devices may use short-range wireless communications links to handle communications with nearby equipment. For example, electronic devices may communicate using the WiFi® (IEEE 802.11) bands at 2.4 GHz and 5 GHz and the Bluetooth® band at 2.4 GHz.

To satisfy consumer demand for small form factor wireless devices, manufacturers are continually striving to implement wireless communications circuitry such as antenna components using compact structures. However, it can be difficult to fit conventional antenna structures into small devices. For example, antennas that are confined to small volumes often exhibit narrower operating bandwidths than antennas that are implemented in larger volumes. If the bandwidth of an antenna becomes too small, the antenna will not be able to cover all communications bands of interest.

In view of these considerations, it would be desirable to provide improved wireless circuitry for electronic devices.

SUMMARY

Electronic devices may be provided that contain wireless communications circuitry. The wireless communications circuitry may include radio-frequency transceiver circuitry and antenna structures. An electronic device may include a display mounted within a housing. A peripheral conductive member may run around the edges of the display and housing.

The peripheral conductive member may be divided into individual segments by forming gaps in the peripheral conductive member at various points along its length. The gaps may be filled with a dielectric such as plastic and may form an open circuit between opposing portions of the conductive member. With one illustrative configuration, three gaps may be formed in the peripheral conductive member to divide the peripheral conductive member into three respective segments.

A conductive housing member such as a conductive midplate member that spans the width of the housing may be connected to the peripheral conductive member at the left and right edges of the display. The conductive housing member and other conductive structures such as electrical components and printed circuits may form a ground plane. The ground plane and the peripheral conductive member segments may surround dielectric openings to form the antenna structures. For example, an upper cellular telephone antenna may be formed at an upper end of the housing and a lower cellular telephone antenna may be formed at a lower end of the housing. In the upper cellular telephone antenna, a first dielectric opening may be surrounded by at least some of a first peripheral conductive member segment and portions of the ground plane. In the lower cellular telephone antenna, a second dielectric opening may be surrounded by at least some of a second peripheral conductive member segment and portions of the ground plane. The upper cellular telephone antenna may be a two-branch inverted-F antenna. The lower cellular telephone antenna may be a loop antenna.

The upper and lower antennas may include associated antenna tuning circuitry. The antenna tuning circuitry may include switchable inductor circuits that bridge the first and second peripheral conductive member segments to the ground plate, tunable impedance matching circuitry, and variable capacitor circuitry bridging each of the gaps in the peripheral conductive member. The tunable matching circuitry may be used to couple the radio-frequency transceiver circuitry to the lower and upper antennas.

During operation of the electronic device, the lower antenna may serve as the primary cellular antenna for the device. Radio-frequency antenna signals may be transmitted and received by the lower antenna in cellular telephone bands such as the bands at 750 MHz, 850 MHz, 900 MHz, 1800 MHz, 1900 MHz, and 2100 MHz. The upper antenna may serve as a secondary antenna that allows the electronic device to implement receiver diversity. When the performance of the lower antenna drops during operation, the radio-frequency transceiver circuitry in the device can receive signals with the upper antenna rather than the lower antenna.

The upper antenna may support only a subset of the bands that are supported by the lower antenna. During a first antenna mode in which the switchable inductor associated with the upper antenna is turned off and the variable capacitors associated with the upper antenna is tuned to exhibit a low capacitance value, the upper antenna may support a first low-band frequency range (e.g., a low-band region that covers 850 MHz and 900 MHz) and a first high-band frequency range (e.g., a high-band region that covers 1800 MHz and 1900 MHz). The coverage of the upper antenna can be extended by tuning the antenna tuning circuitry associated with the upper antenna in real time.

For example, the upper antenna may be configured in a second antenna mode in which the variable capacitors are tuned to exhibit higher capacitance values so that the upper antenna may support a second low-band frequency range (e.g., a low-band region that covers 750 MHz) that is lower in frequency than the first low-band frequency range. The upper antenna may be configured in a third antenna mode in which the switchable inductor is turned on so that the upper antenna may support a second high-band frequency range (e.g., a high-band region that covers 2100 MHz) that is higher in frequency than the first high-band frequency range.

Further features of the invention, its nature and various advantages will be more apparent from the accompanying drawings and the following detailed description of the preferred embodiments.

BRIEF DESCRIPTION OF THE DRAWINGS

FIG. 10 is a chart showing how antennas of the type shown in FIG. 6 may be used in covering communications bands of interest by adjusting associated antenna tuning circuitry in accordance with an embodiment of the present invention.

DETAILED DESCRIPTION

Electronic devices may be provided with wireless communications circuitry. The wireless communications circuitry may be used to support wireless communications in multiple wireless communications bands. The wireless communications circuitry may include one or more antennas.

The antennas can include loop antennas, inverted-F antennas, strip antennas, planar inverted-F antennas, slot antennas, hybrid antennas that include antenna structures of more than one type, or other suitable antennas. Conductive structures for the antennas may, if desired, be formed from conductive electronic device structures. The conductive electronic device structures may include conductive housing structures. The housing structures may include a peripheral conductive member that runs around the periphery of an electronic device. The peripheral conductive member may serve as a bezel for a planar structure such as a display, may serve as sidewall structures for a device housing, or may form other housing structures. Gaps in the peripheral conductive member may be associated with the antennas.

Figure 1:
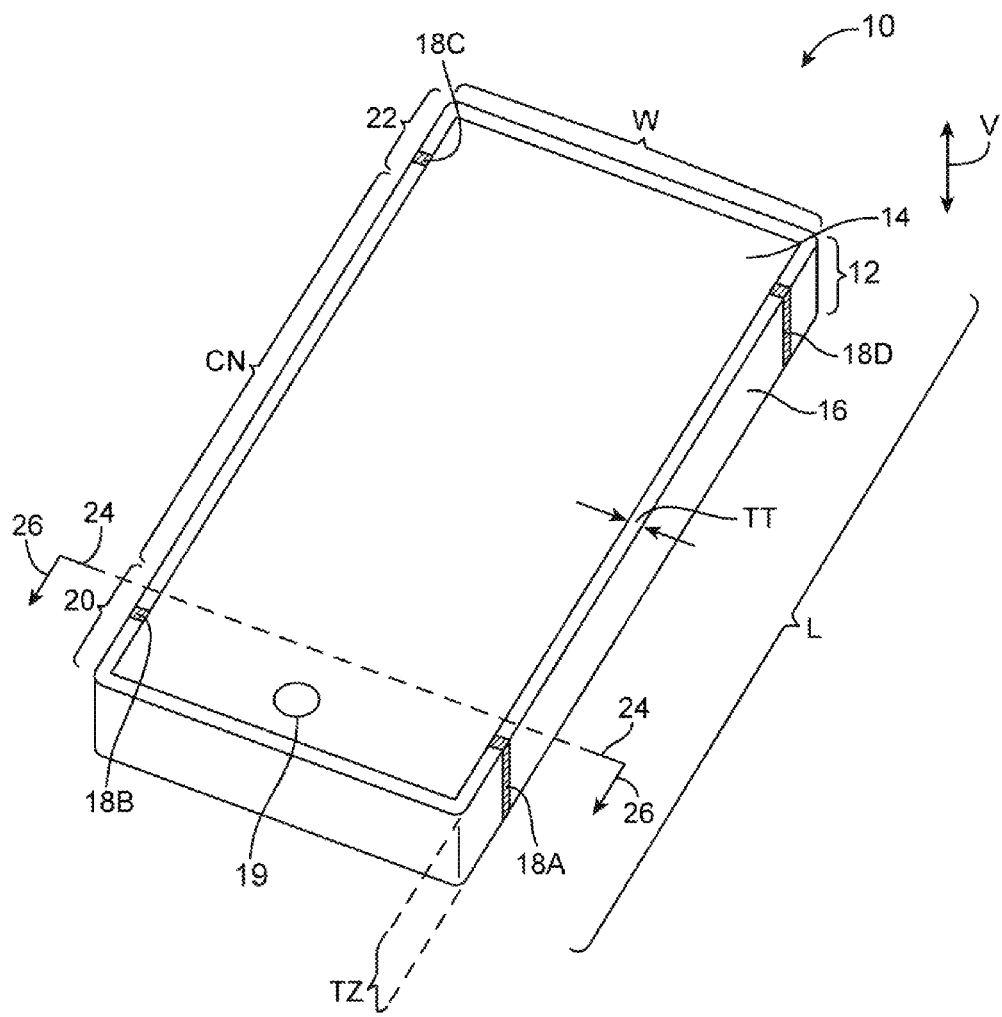
FIG. 1 is a perspective view of an illustrative electronic device with wireless communications circuitry in accordance with an embodiment of the present invention.

An illustrative electronic device of the type that may be provided with one or more antennas is shown in FIG. 1. Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, a media player, etc.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. Display 14 may, for example, be a touch screen that incorporates capacitive touch electrodes. Display 14 may include image pixels formed from light-emitting diodes (LEDs), organic LEDs (OLEDs), plasma cells, electronic ink elements, liquid crystal display (LCD) components, or other suitable image pixel structures. A cover glass layer may cover the surface of display 14. Buttons such as button 19 may pass through openings in the cover glass.

Housing 12 may include structures such as peripheral member 16. Member 16 may run around the rectangular periphery of device 10 and display 14. Member 16 or part of member 16 may serve as a bezel for display 14 (e.g., a cosmetic trim that surrounds all four sides of display 14 and/or helps hold display 14 to device 10). Member 16 may also, if desired, form sidewall structures for device 10.

Member 16 may be formed of a conductive material and may therefore sometimes be referred to as a peripheral conductive member or conductive housing structures. Member 16 may be formed from a metal such as stainless steel, aluminum, or other suitable materials. One, two, or more than two separate structures may be used in forming member 16. In a typical configuration, member 16 may have a thickness (dimension TT) of about 0.1 mm to 3 mm (as an example). The sidewall portions of member 16 may, as an example, be substantially vertical (parallel to vertical axis V). Parallel to axis V, member 16 may have a dimension TZ of about 1 mm to 2 cm (as an example). The aspect ratio R of member 16 (i.e., the ratio R of TZ to TT) is typically more than 1 (i.e., R may be greater than or equal to 1, greater than or equal to 2, greater than or equal to 4, greater than or equal to 10, etc.).

It is not necessary for member 16 to have a uniform cross-section. For example, the top portion of member 16 may, if desired, have an inwardly protruding lip that helps hold display 14 in place. If desired, the bottom portion of member 16 may also have an enlarged lip (e.g., in the plane of the rear surface of device 10). In the example of FIG. 1, member 16 has substantially straight vertical sidewalls. This is merely illustrative. The sidewalls of member 16 may be curved or may have any other suitable shape. In some configurations (e.g., when member 16 serves as a bezel for display 14), member 16 may run around the lip of housing 12 (i.e., member 16 may cover only the edge of housing 12 that surrounds display 14 and not the rear edge of housing 12 of the sidewalls of housing 12).

Display 14 may include conductive structures such as an array of capacitive electrodes, conductive lines for addressing pixel elements, driver circuits, etc. Housing 12 also include internal structures such as metal frame members, a planar housing member (sometimes referred to as a midplate) that spans the walls of housing 12 (i.e., a substantially rectangular member that is welded or otherwise connected between opposing sides of member 16), printed circuit boards, and other internal conductive structures. These conductive structures may be located in center CN of housing 12 (as an example).

In regions 22 and 20, openings may be formed between the conductive housing structures and conductive electrical components that make up device 10. These openings may be filled with air, plastic, or other dielectrics. Conductive housing structures and other conductive structures in region CN of device 10 may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, or may otherwise serve as part of antenna structures formed in regions 20 and 22.

Portions of member 16 may be provided with gap structures. For example, member 16 may be provided with one or more gaps such as gaps 18A, 18B, 18C, and 18D, as shown in FIG. 1. The gaps may be filled with dielectric such as polymer, ceramic, glass, etc. Gaps 18A, 18B, 18C, and 18D may divide member 16 into one or more peripheral conductive member segments. There may be, for example, two segments of member 16 (e.g., in an arrangement with two gaps), three segments of member 16 (e.g., in an arrangement with three gaps), four segments of member 16 (e.g., in an arrangement with four gaps, etc.). The segments of peripheral conductive member 16 that are formed in this way may form parts of antennas in device 10.

In a typical scenario, device 10 may have upper and lower antennas (as an example). An upper antenna may, for example, be formed at the upper end of device 10 in region 22. A lower antenna may, for example, be formed at the lower end of device 10 in region 20. The antennas may be used separately to cover separate communications bands of interest or may be used together to implement an antenna diversity scheme or a multiple-input-multiple-output (MIMO) antenna scheme.

Antennas in device 10 may be used to support any communications bands of interest. For example, device 10 may include antenna structures for supporting local area network communications, voice and data cellular telephone communications, global positioning system (GPS) communications or other satellite navigation system communications, Bluetooth® communications, etc.

Figure 2:
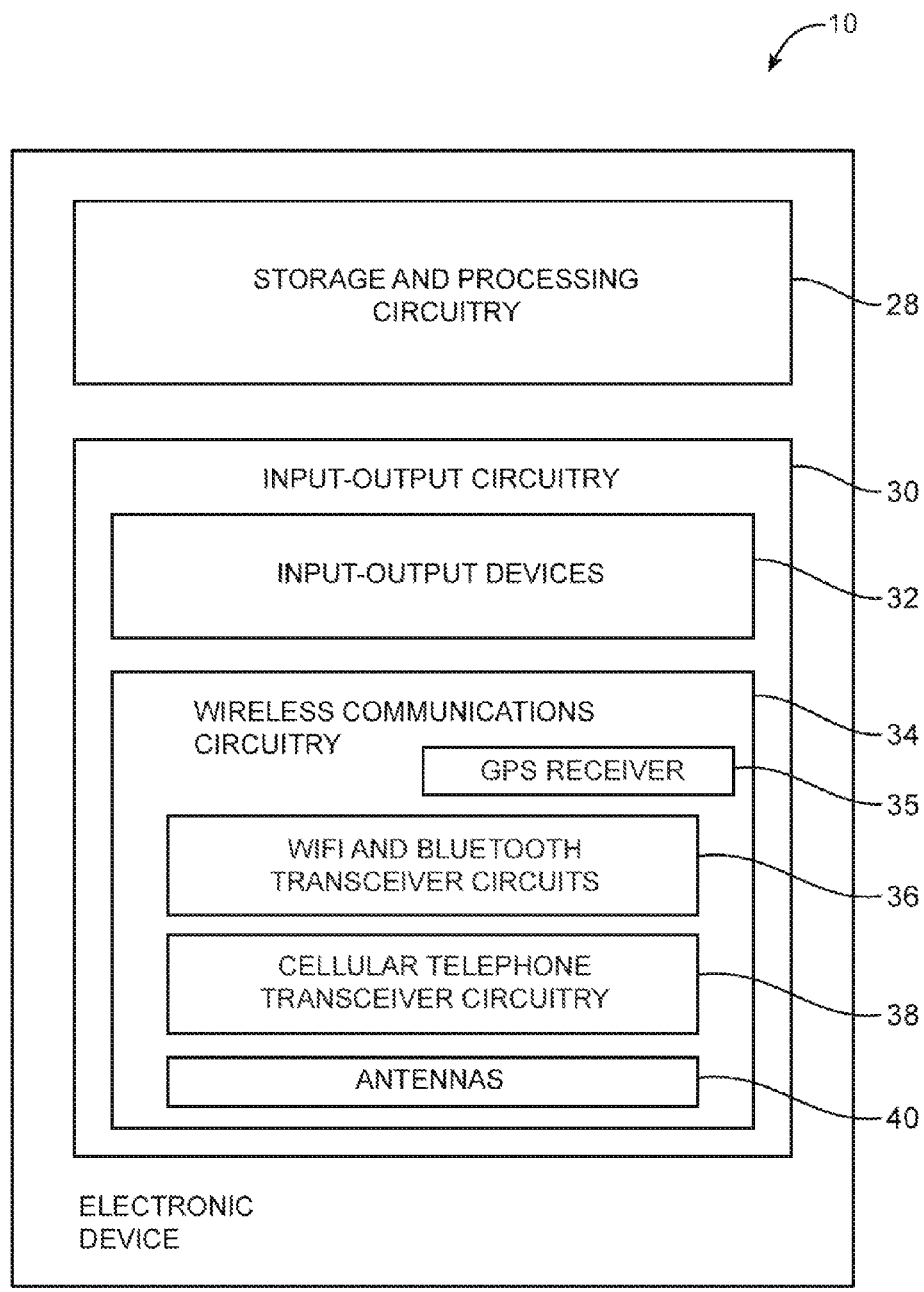
FIG. 2 is a schematic diagram of an illustrative electronic device with wireless communications circuitry in accordance with an embodiment of the present invention.

A schematic diagram of electronic device 10 is shown in FIG. 2. As shown in FIG. 2, electronic device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, baseband processors, power management units, audio codec chips, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Circuitry 28 may be configured to implement control algorithms that control the use of antennas in device 10. For example, to support antenna diversity schemes and MIMO schemes or other multi-antenna schemes, circuitry 28 may perform signal quality monitoring operations, sensor monitoring operations, and other data gathering operations and may, in response to the gathered data, control which antenna structures within device 10 are being used to receive and process data. As an example, circuitry 28 may control which of two or more antennas is being used to receive incoming radio-frequency signals, may control which of two or more antennas is being used to transmit radio-frequency signals, may control the process of routing incoming data streams over two or more antennas in device 10 in parallel, etc. In performing these control operations, circuitry 28 may open and close switches, may turn on and off receivers and transmitters, may adjust impedance matching circuits, may configure switches in front-end-module (FEM) radio-frequency circuits that are interposed between radio-frequency transceiver circuitry and antenna structures (e.g., filtering and switching circuits used for impedance matching and signal routing), and may otherwise control and adjust the components of device 10.

Input-output circuitry 30 may be used to allow data to be supplied to device 10 and to allow data to be provided from device 10 to external devices. Input-output circuitry 30 may include input-output devices 32. Input-output devices 32 may include touch screens, buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 32 and may receive status information and other output from device 10 using the output resources of input-output devices 32.

Wireless communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Wireless communications circuitry 34 may include satellite navigation system receiver circuitry such as Global Positioning System (GPS) receiver circuitry 35 (e.g., for receiving satellite positioning signals at 1575 MHz). Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as bands at 700 MHz, 710 MHz, 750 MHz, 850 MHz, 900 MHz, 1800 MHz, 1900 MHz, and 2100 MHz or other cellular telephone bands of interest.

Wireless communications circuitry 34 can include circuitry for other short-range and long-range wireless links if desired. For example, wireless communications circuitry 34 may include global positioning system (GPS) receiver equipment, wireless circuitry for receiving radio and television signals, paging circuits, etc. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable antenna types. For example, antennas 40 may include antennas with resonating elements that are formed from loop antenna structure, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna and another type of antenna may be used in forming a remote wireless link.

Figure 3:
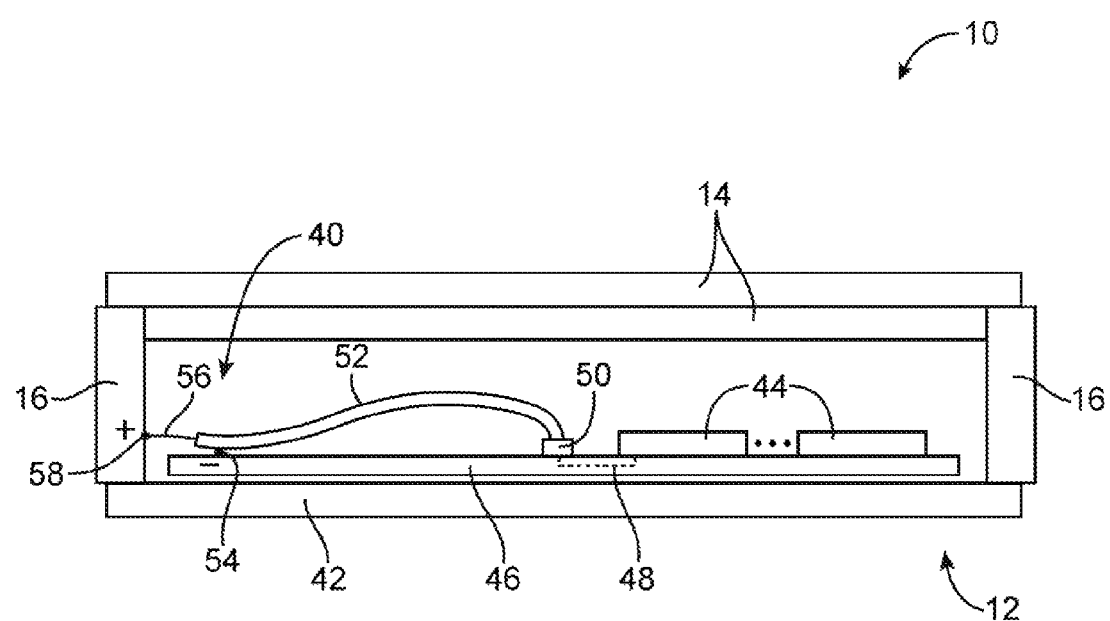
FIG. 3 is a cross-sectional end view of an illustrative electronic device with wireless communications circuitry in accordance with an embodiment of the present invention.

A cross-sectional side view of device 10 of FIG. 1 taken along line 24-24 in FIG. 1 and viewed in direction 26 is shown in FIG. 3. As shown in FIG. 3, display 14 may be mounted to the front surface of device 10. Housing 12 may include sidewalls formed from member 16 and one or more rear walls formed from structures such as planar rear housing structure 42. Structure 42 may be formed from a dielectric such as glass, ceramic, or plastic, and/or metals or other suitable materials (e.g., fiber composites). Snaps, clips, screws, adhesive, and other structures may be used in assembling the parts of housing 12 together.

Device 10 may contain printed circuit boards such as printed circuit board 46. Printed circuit board 46 and the other printed circuit boards in device 10 may be formed from rigid printed circuit board material (e.g., fiberglass-filled epoxy) or flexible sheets of material such as polymers. Flexible printed circuit boards ("flex circuits") may, for example, be formed from flexible sheets of polyimide.

Printed circuit board 46 may contain interconnects such as interconnects 48. Interconnects 48 may be formed from conductive traces (e.g., traces of gold-plated copper or other metals). Connectors such as connector 50 may be connected to interconnect 48 using solder or conductive adhesive (as examples). Integrated circuits, discrete components such as resistors, capacitors, and inductors, and other electronic components may be mounted to printed circuit board 46.

Antennas in device 10 such as illustrative antenna 40 of FIG. 3 may have antenna feed terminals. For example, each antenna in device 10 may have a positive antenna feed terminal such as positive antenna feed terminal 58 and a ground antenna feed terminal such as ground antenna feed terminal 54. As shown in the illustrative arrangement of FIG. 3, a transmission line path such as coaxial cable 52 may be coupled between the antenna feed formed from terminals 58 and 54 and transceiver circuitry in components 44 via connector 50 and interconnects 48. Components 44 may include one or more integrated circuits for implementing wireless circuitry 34 of FIG. 2 (e.g., receiver 35 and transceiver circuits 36 and 38).

Connectors such as connector 50 may be used in coupling transmission lines in device 10 to printed circuit boards such as board 46. Connector 50 may be, for example, a coaxial cable connector that is connected to printed circuit board 46 using solder (as an example). Cable 52 may be a coaxial cable or other transmission line. Examples of transmission lines that may be used in device 10 include coaxial cables, microstrip and stripline transmission lines formed from a flex circuit or rigid printed circuit board, transmission lines that are formed from multiple transmission line structures such as these, etc.

When coupled to the feed of antenna 40, transmission line 52 may be used to transmit and receive radio-frequency signals using antenna 40. As shown in FIG. 3, terminal 58 may be coupled to coaxial cable center connector 56. Terminal 54 may be connected to a ground conductor in cable 52 (e.g., a conductive outer braid conductor). Other arrangements may be used for coupling transceivers in device 10 to antenna 40 if desired. For example, impedance matching circuits may be used in coupling transceiver circuitry to antenna structures. The arrangement of FIG. 3 is merely illustrative.

In the illustrative example of FIG. 3, device 10 includes antenna 40. To enhance signal quality and to cover multiple bands of interest, device 10 may contain multiple antennas. With one suitable arrangement, which is sometimes described herein as an example, a WiFi® antenna may be located in region 22, a first (e.g., a primary) cellular telephone antenna may be located in region 20, and a second (e.g., secondary) cellular telephone antenna may be located in region 22. The second cellular telephone antenna may, if desired, be configured to receive GPS signals. Illustrative wireless circuitry 34 that includes an antenna arrangement of this type is shown in FIG. 4.

Figure 4:
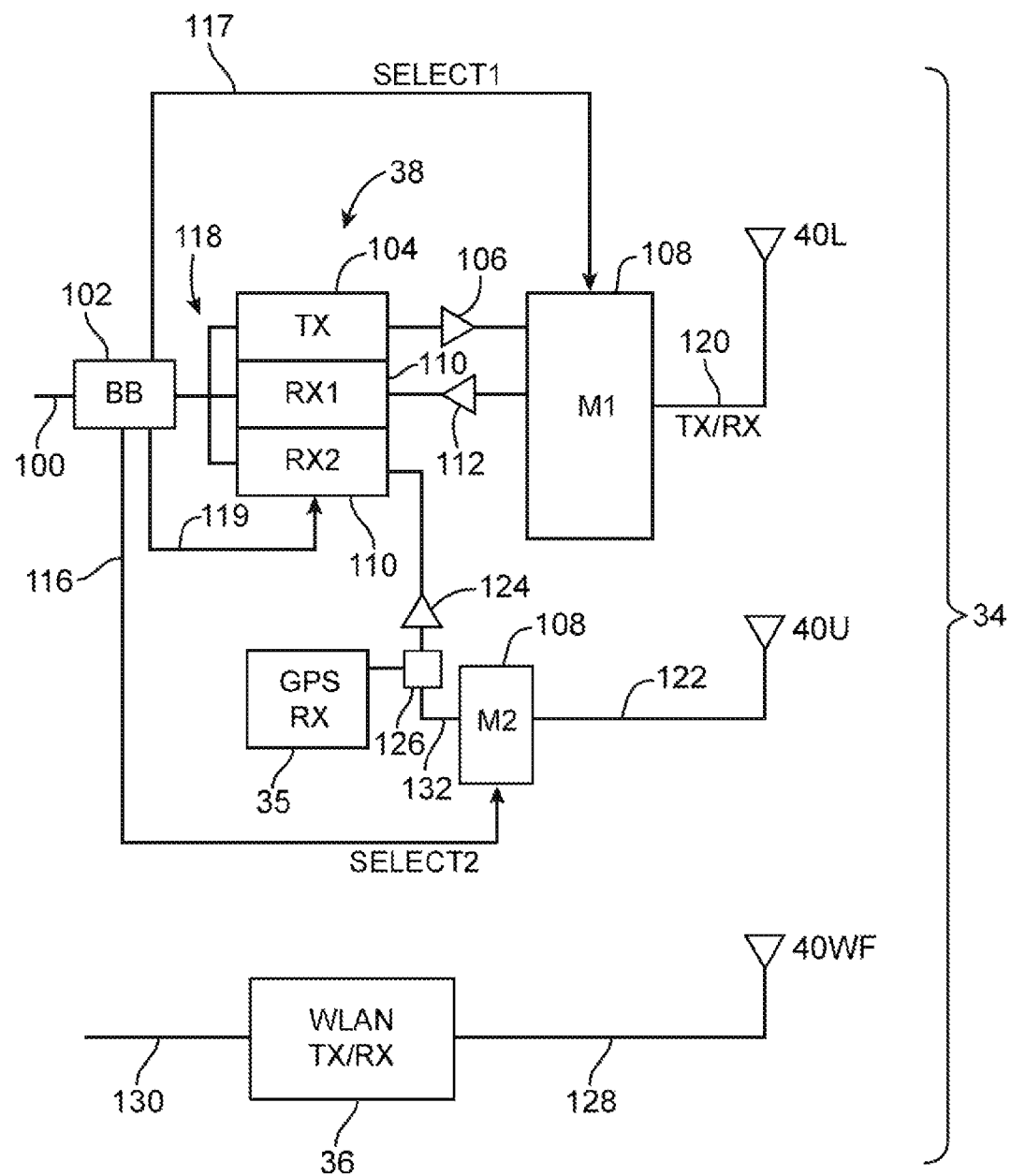
FIG. 4 is a diagram of illustrative wireless circuitry including multiple antennas in accordance with an embodiment of the present invention.

As shown in FIG. 4, wireless circuitry 34 may have input-output ports such as ports 100 and 130 for interfacing with digital data circuits in storage and processing circuitry 28. Wireless circuitry 34 may include one or more integrated circuits for implementing transceiver circuits such as baseband processor 102 and cellular telephone transceiver circuitry 38. Port 100 may receive digital data from storage and processing circuitry 28 for transmission over antenna 40L. Incoming data that has been received by antennas 40U and 40L, cellular transceiver circuitry 38, and baseband processor 102 may be supplied to storage and processing circuitry 28 via port 100. Port 130 may be used to handle digital data associated with transmitted and received wireless local area network signals such as WiFi® signals (as an example). Outgoing digital data that is supplied to port 130 by storage and processing circuitry 28 may be transmitted using wireless local area network transceiver circuitry 36, paths such as path 128, and one or more antennas such as antenna 40WF. During data reception operations, signals received by antenna 40WF may be provided to transceiver 36 via path 128. Transceiver 36 may convert the incoming signals to digital data. The digital data may be provided to storage and processing circuitry 28 via port 130. If desired, local signals such as Bluetooth® signals may also be transmitted and received via antennas such as antenna 40WF.

Transceiver circuitry 38 may include one or more transmitters and one or more receivers. In the example of FIG. 4, transceiver circuitry 38 includes radio-frequency transmitter 104 and radio-frequency receivers 110. Transmitter 104 and receivers 110 (i.e., receiver RX1 and receiver RX2) may be used to handle cellular telephone communications. Signals that are received by transmitter 104 over path 118 may be supplied to power amplifier 106 by transmitter 104. Power amplifier 106 may strengthen these outgoing signals for transmission over antenna 40L. Incoming signals that are received by antenna 40L may be amplified by low noise amplifier 112 and provided to receiver RX1. Receiver RX1 may provide data received from antenna 40U to processor 102 via path 118. Incoming signals that are received by antenna 40U may be amplified by low noise amplifier 124 and provided to receiver RX2 (or to RX1 using a switch). Receiver RX2 may provide data received from antenna 40L to processor 102 via path 118. Circuits such as transmitter 104 and receivers 110 may each have multiple ports (e.g., for handling different respective communications bands) and may be implemented using one or more individual integrated circuits.

Antennas 40U and 40L may be coupled to transceiver circuitry 38 using circuitry such as impedance matching circuitry, filters, and switches. This circuitry, which is sometimes referred to as front-end module (FEM) circuitry, can be controlled by storage and processing circuitry in device 10 (e.g., control signals from a processor such as baseband processor 102). As shown in the example of FIG. 4, the front-end circuitry in wireless circuitry 34 may include impedance matching circuitry 108 such as tunable matching circuitry M1 and tunable matching circuitry M2. Impedance matching circuitry M1 and M2 may be formed using conductive structures with associated capacitance, resistance, and inductance values, and/or discrete components such as inductors, capacitors, and resistors that form circuits to match the impedances of transceiver circuitry 38 and antennas 40U and 40L. Matching circuitry M1 may be coupled between wireless transceiver circuitry 38 (including associated amplifier circuitry 106 and 112) and antenna 40L. Matching circuitry M2 may be coupled between transceiver circuitry 38 (and associated amplifier 124) and antenna 40U using paths such as paths 132 and 122.

Matching circuitry M1 and M2 may be fixed or adjustable. For example, matching circuitry M1 may be fixed and matching circuitry M2 may be adjustable. As another example, matching circuitry M1 may be adjustable and matching circuitry M2 may be fixed. As another example, matching circuitry M1 and M2 may both be adjustable. In this type of configuration, a control circuit such as baseband processor 102 may issue control signals such as signal SELECT1 on path 117 to configure tunable matching circuitry M1 and may issue control signals such as signal SELECT2 on path 116 to configure tunable matching circuitry M2.

Matching circuitry M1 may be placed in a first configuration when SELECT1 has a first value and may be placed in a second configuration when SELECT1 has a second value. The state of matching circuitry M1 may serve to fine tune the coverage provided by antenna 40L. Similarly, matching circuitry M2 may be placed in a first configuration when SELECT2 has a first value and may be placed in a second configuration when SELECT2 has a second value. The state of matching circuitry M2 may serve to fine tune the coverage provided by antenna 40U. Matching circuitry M1 and M2 may or may not be used. By using an antenna tuning scheme of this type, antennas 40L and 40U may be able to cover a wider range of communications frequencies than would otherwise be possible. The use of tuning for antennas 40L and 40U may allow a relatively narrow bandwidth (and potentially compact) design to be used for antennas 40L and 40U, if desired.

Control signals may be provided to receiver circuitry 110 over path 119 so that wireless circuitry 34 can selectively activate one or both of receivers RX1 and RX2 or can otherwise select which antenna signals are being received in real time (e.g., by controlling a multiplexer in circuitry 34 that routes signals from a selected one of the antennas to a shared receiver so that the receiver can be shared between antennas). For example, baseband processor 102 or other storage and processing circuitry in device 10 can monitor signal quality (bit error rate, signal-to-noise ratio, frame error rate, signal power, etc.) for signals being received by antennas 40U and 40L. Based on real-time signal quality information or other data (e.g., sensor data indicating that a particular antenna is blocked), signals on path 119 or other suitable control signals can be adjusted so that optimum receiver circuitry (e.g., receiver RX1 or RX2) is used to receive the incoming signals. Antenna diversity schemes such as this in which circuitry 34 selects an optimum antenna and receiver to use in real time based on signal quality measurements or other information while radio-frequency signals are transmitted by a fixed antenna and transmitter (i.e., antenna 40L and transmitter 104) may sometimes be referred to as receiver diversity schemes.

In a receiver diversity configuration (i.e., in a device without transmitter diversity), the radio-frequency transmitter circuitry in a device is configured to receive signals through two or more different antennas, so that an optimum antenna can be chosen in real time to enhance signal reception, whereas the radio-frequency transceiver circuitry is configured to transmit signals through only a single one of the antennas and not others. If desired, wireless circuitry 34 may be configured to implement both receiver and transmitter diversity and/or may be configured to handle multiple simultaneous data streams (e.g., using a MIMO arrangement). The use of wireless circuitry 34 to implement a receiver diversity scheme while using a dedicated antenna for handling transmitted signals is merely illustrative.

As shown in FIG. 4, wireless circuitry 34 may be provided with filter circuitry such as filter circuitry 126. Circuitry 126 may route signals by frequency, so that cellular telephone signals are conveyed between antenna 40U and receiver RX2, whereas GPS signals that are received by antenna 40U are routed to GPS receiver 35.

Figure 5A:
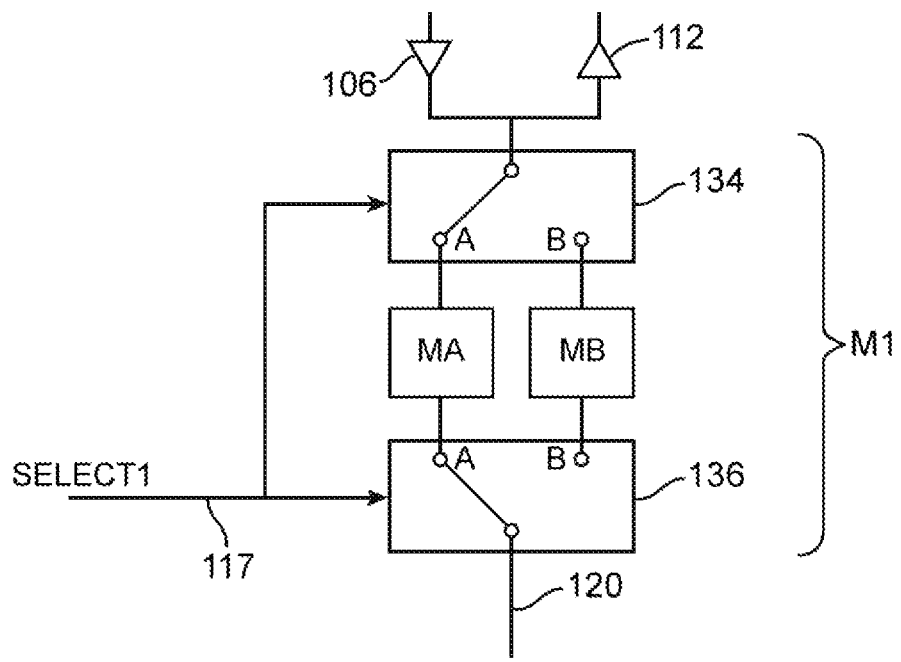
FIGS. 5A and 5B are circuit diagrams showing illustrative tunable impedance matching circuitry of the type that may be used in connection with the wireless circuitry of FIG. 4 in accordance with an embodiment of the present invention.

Illustrative configurable circuitry that may be used for implementing matching circuitry M1 is shown in FIG. 5A. As shown in FIG. 5A, matching circuitry M1 may have switches such as switches 134 and 136. Switches 134 and 136 may have multiple positions (shown by the illustrative A and B positions in FIG. 5A). When signal SELECT1 has a first value, switches 134 and 136 may be placed in their A positions and matching circuit MA may be switched into use (as shown in FIG. 5A), so that matching circuit MA is electrically coupled between paths 120 and amplifiers 106 and 112. When signal SELECT1 has a second value, switches 134 and 136 may be placed in their B positions.

Figure 5B:
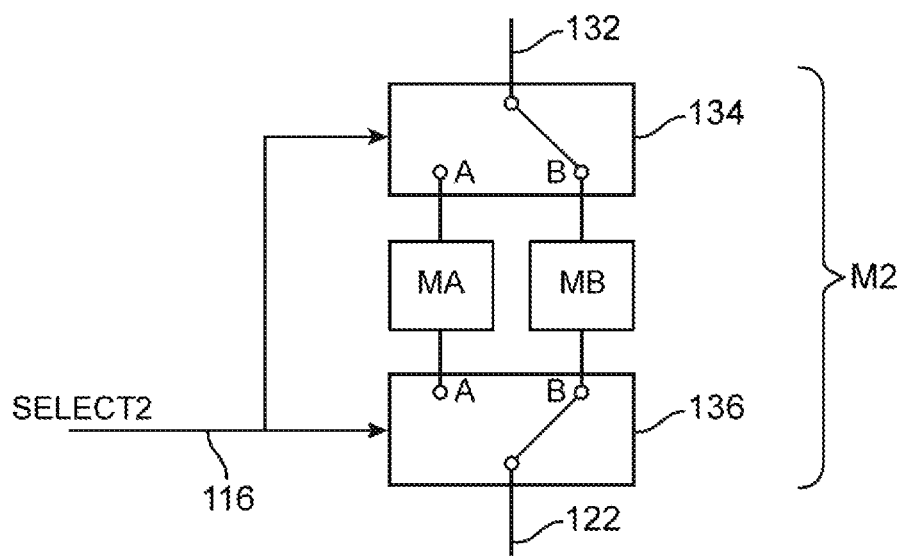

Illustrative configurable circuitry that may be used for implementing matching circuitry M2 is shown in FIG. 5B. As shown in FIG. 5B, matching circuitry M2 may have switches such as switches 134 and 136. Switches 134 and 136 may have multiple positions (shown by the illustrative A and B positions in FIG. 5B). When signal SELECT2 has a first value, switches 134 and 136 may be placed in their A positions and matching circuit MA may be switched into use. When signal SELECT2 has a second value, switches 134 and 136 may be placed in their B positions (as shown in FIG. 5B), so that matching circuit MB is electrically coupled between paths 122 and 132.

Figure 6:
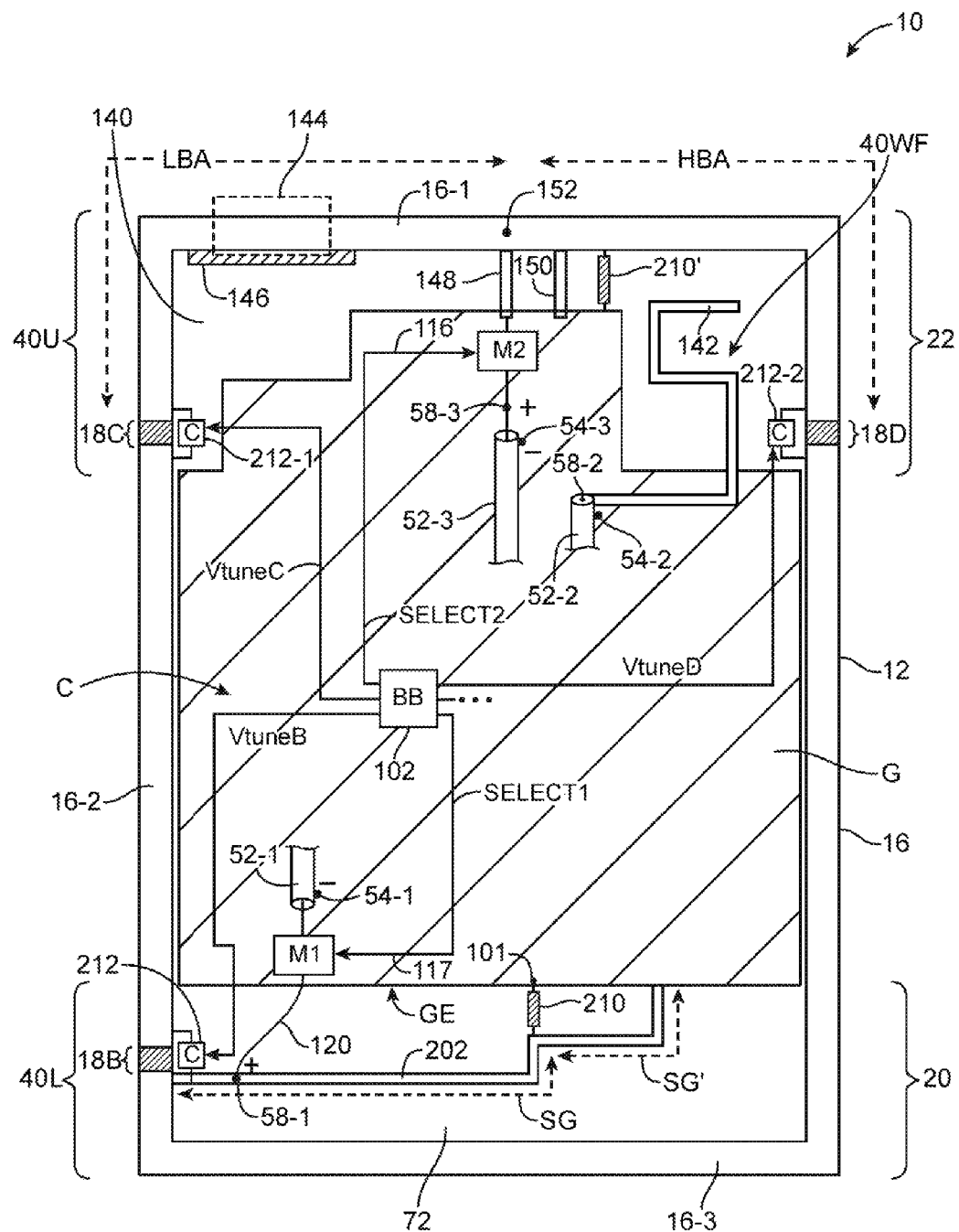
FIG. 6 is a diagram of an electronic device of the type shown in FIG. 1 showing how antennas with antenna tuning circuitry may be formed within the device in accordance with an embodiment of the present invention.

FIG. 6 is a top view of the interior of device 10 showing how antennas 40L, 40U, and 40WF may be implemented within housing 12. As shown in FIG. 6, ground plane G may be formed within housing 12. Ground plane G may form antenna ground for antennas 40L, 40U, and 40WF. Because ground plane G may serve as antenna ground, ground plane G may sometimes be referred to as antenna ground, ground, or a ground plane element (as examples).

In central portion C of device 10, ground plane G may be formed by conductive structures such as a conductive housing midplate member that is connected between the left and right edges of member 16, printed circuit boards with conductive ground traces, etc. At ends 22 and 20 of device 10, the shape of ground plane G may be determined by the shapes and locations of conductive structures that are tied to ground. Examples of conductive structures that may overlap to form ground plane G include housing structures (e.g., a conductive housing midplate structure, which may have protruding portions), conductive components (e.g., switches, cameras, data connectors, printed circuits such as flex circuits and rigid printed circuit boards, radio-frequency shielding cans, buttons such as button 144 and conductive button mounting structure 146), and other conductive structures in device 10. In the illustrative layout of FIG. 6, the portions of device 10 that are conductive and tied to ground to form part of ground plane G are shaded and are contiguous with central portion C.

Openings such as openings 72 and 140 may be formed between ground plane G and respective portions of peripheral conductive member 16. Openings 72 and 140 may be filled with air, plastic, and other dielectrics. Opening 72 may be associated with antenna structure 40L, whereas opening 140 may be associated with antenna structures 40U and 40WF.

Gaps such as gaps 18B, 18C, and 18D may be present in peripheral conductive member 16 (gap 18A of FIG. 1 may be absent or may be implemented using a phantom gap structure that cosmetically looks like a gap from the exterior of device 10, but that is electrically shorted within the interior of housing 12 so that no gap is electrically present in the location of gap 18A). The presence of gaps 18B, 18C, and 18D may divide peripheral conductive member 16 into segments. As shown in FIG. 6, peripheral conductive member 16 may include first segment 16-1, second segment 16-2, and third segment 16-3.

Lower antenna 40L may be formed using a parallel-fed loop antenna structure having a shape that is determined at least partly by the shape of the lower portions of ground plane G and conductive housing segment 16-3. As shown in FIG. 6, antenna 40L may be formed in lower region 20 of device 10. The portion of conductive segment 16-3 that surrounds opening 72 and the portions of ground plane G that lie along edge GE of ground plane G form a conductive loop around opening 72. The shape of opening 72 may be dictated by the placement of conductive structures in region 20 such as a microphone, flex circuit traces, a data port connector, buttons, a speaker, etc.

Conductive structure 202 may bridge dielectric opening 72 and may be used to electrically short ground plane G to peripheral housing segment 16-3. Conductive structure 202 may be formed using strips of conductive material, flex circuit traces, conductive housing structures, or other conductive structures. If desired, conductive structure 202 may be formed using discrete components such as surface mount technology (SMT) inductors. Transmission line 52-1 (e.g., a coaxial cable) may be used to feed antenna 40L at positive and negative antenna feed terminals 58-1 and 54-1, respectively.

Antenna 40L may include associated tunable (configurable) antenna circuitry such as switchable inductor circuit 210, tunable impedance matching circuitry M1, variable capacitor circuit 212, and other suitable tunable circuits. The tunable antenna circuitry associated with antenna 40L may, for example, allow antenna 40L to operate in at least six wireless communications bands (e.g., to transmit and receive radio-frequency signals at 750 MHz, 800 MHz, 900 MHz, 1800 MHz, 1900 MHz, 2100 MHz, etc.).

Conductive structure 202 may have a first conductive segment SG and a second inductive segment SG' formed in series between peripheral segment 16-3 and ground G. Segment SG may exhibit a first inductance, segment SG' may exhibit a second inductance, and circuit 202 may exhibit a third inductance. Switchable inductor circuit (also referred to as tunable inductor circuit, configurable inductor circuit, or adjustable inductor circuit) 210 may be coupled between a point at which segments SG and SG' are joined and a corresponding point 101 on ground plane edge GE.

When circuit 210 is switched into use (e.g., when circuit 210 is turned on), segment SG and circuit 210 collectively form a first transmission line path that bridges the antenna feeds of antenna 40L. The first transmission line path may have an inductance that is equal to the series inductance of the first and third inductance. When circuit 210 is switched out of use (e.g., when circuit 210 is turned off), segments SG and SG' may collectively form a second transmission line path that bridges the antenna feeds of antenna 40L. The second transmission line path may have an inductance that is equal to the series inductance of the first and second inductance. Switchable inductor 210 serves to shunt a portion of the second transmission line path so that the inductance associated with the first transmission line path when circuit 210 is turned on is less than the inductance associated with the second transmission line path when circuit 210 is turned off.

The first transmission line inductance (i.e., the inductance of the first transmission line path) may be different than the second transmission line inductance (i.e., the inductance of the second transmission line path). The first transmission line inductance may be equal to 18 nH, whereas the second transmission line inductance may be equal to 20 nH (as an example). The first transmission line path (if circuit 210 is enabled) and the second transmission line path (if circuit 210 is disabled) are connected in parallel between feed terminals 54-1 and 58-1 and serve as parallel inductive tuning elements for antenna 40L. The first and second transmission line paths may therefore sometimes be referred to as a variable inductor. The inductance of segments SG and SG' are carefully chosen to provide desired band coverage.

Tunable impedance matching circuitry M1 may be coupled between coaxial cable 52-1 and positive feed terminal 58-1. Impedance matching circuitry M1 may be formed using switching circuitry of the type described in connection with FIG. 5A, conductive structures with associated capacitance, resistance, and inductance values, and/or discrete components such as inductors, capacitors, and resistors that form circuits to match the impedances of transceiver circuitry 38 and antenna 40L.

Variable capacitor circuit (sometimes referred to as a varactor circuit, a tunable capacitor circuit, an adjustable capacitor circuit, etc.) 212 may be coupled between opposing ends of bezel gap 18B. Baseband processor 102 may issue control voltage VtuneB to fine tune varactor 212 so that antenna 40L operates at desired frequencies.

Bezel gap 18B may, for example, have an intrinsic capacitance of 1 pF (e.g., an inherent capacitance value formed by the parallel conductive surfaces at gap 18B). Component 212 may be, for example, a continuously variable capacitor, a semi-continuously adjustable capacitor that has two to four or more different capacitance values that can be coupled in parallel to the intrinsic capacitance. If desired, component 212 may be a continuously variable inductor or a semi-continuously adjustable inductor that has two or more different inductance values.

Antenna 40WF may have an antenna resonating element formed from a strip of conductor such as strip 142. Strip 142 may be formed from a trace on a flex circuit, from a trace on a rigid printed circuit board, from a strip of metal foil, or from other conductive structures. Antenna 40WF may be fed by transmission line 52-2 (see, e.g., path 128 of FIG. 4) using antenna feed terminals 58-2 and 54-2.

Antenna 40U may include associated tunable (configurable) antenna circuitry such as switchable inductor circuit 210', tunable impedance matching circuitry M2, variable capacitor circuits 212-1 and 212-2, and other suitable tunable circuits. The tunable antenna circuitry associated with antenna 40U may allow antenna 40U to have a wider coverage than otherwise possible.

Antenna 40U may be a two-branch inverted-F antenna. Transmission line 52-3 (see, e.g., path 120 of FIG. 4) may be used to feed antenna 40U at antenna feed terminals 58-3 and 54-3. Conductive structure 150 may be bridge dielectric opening 140 and may be used to electrically short ground plane G to peripheral housing member 16. Conductive structure 148 and matching circuitry M2 may be used to connect antenna feed terminal 58-3 to peripheral conductive member 16 at point 152. Conductive structures such as structures 148 and 150 may be formed by flex circuit traces, conductive housing structures, springs, screws, or other conductive structures.

Peripheral conductive segment 16-1 may form antenna resonating element arms for antenna 40U. In particular, a first portion of segment 16-1 (having arm length LBA) may extend from point 152 (where segment 16-1 is fed) to the end of segment 16-1 that is defined by gap 18C and a second portion of segment 16-1 (having arm length HBA) may extend from point 152 to the opposing end of segment 16-1 that is defined by gap 18D. The first and second portions of segment 16-1 may form respective branches of an inverted F antenna and may be associated with respective low band (LB) and high band (HB) antenna resonances for antenna 40U.

Switchable inductor circuit 210' may be coupled in parallel with structures 148 and 150 between segment 16-1 and ground plane G. Circuit 210' may be coupled to the right of structure 150 (as shown in FIG. 6 when device 10 is viewed from the top) or may be coupled to the left of structure 150. Circuit 210' may serve to provide wider high band coverage for antenna 40U. Antenna 40U may operate in a first high-band region when circuit 210' is switched out of use, whereas antenna 40U may operate in a second high-band region that is higher in frequency than the first high-band region when circuit 210' is switched into use. For example, antenna 40U may be used to receive signals in the 1900 MHz band when circuit 210' is turned off and in the 2100 MHz band when circuit 210' is turned on.

Variable capacitor circuit 212-1 may be coupled between opposing ends of conductive bezel gap 18C, whereas variable capacitor circuit 212-2 may be coupled between opposing ends of bezel gap 18D. Circuit 212-2 need not be formed, if desired. Varactors 212-1 and 212-2 may be formed from using integrated circuits, one or more discrete components (e.g., SMT components), etc.

Variable capacitor 212-1 may serve to provide wider low-band coverage for antenna 40U. Baseband processor 102 may issue control voltage VtuneC to tune varactor 212-1 to configure antenna 40U to operate in first and second low-band regions. For example, antenna 40U may be used to receive signals in the 850 MHz band when varactor 212-1 is tuned to exhibit a low capacitance value (e.g., less than 0.1 pF) and to receive signals in the 750 MHz band when varactor 212-1 is tuned to exhibit a high capacitance value (e.g., greater than 0.2 pF).

For example, bezel gaps 18C and 18D may each have an intrinsic capacitance of 1.0 pF (e.g., an inherent capacitance value formed by the parallel conductive surfaces at gaps 18C and 18D). Varactors 212-1 and 212-2 may be, for example, continuously variable capacitors, semi-continuously adjustable capacitors that have two to four or more different capacitance values that can be coupled in parallel to the intrinsic capacitance.

Figure 7:
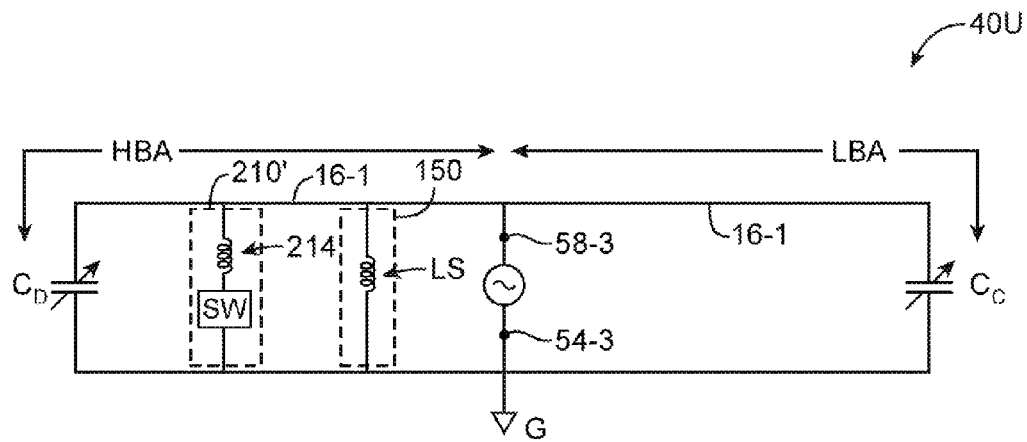
FIGS. 7-9 are diagrams of an antenna of the type shown in the upper portion of the device of FIG. 6 in accordance with an embodiment of the present invention.

FIG. 7 is a circuit diagram of antenna 40U. As shown in FIG. 7, capacitances $C_C$ and $C_D$ may respectively be associated with gaps 18C and 18D. Capacitance $C_C$ may represent a lumped capacitance that includes the parasitic capacitance of gap 18C and varactor 212-1, whereas capacitance $C_D$ may represent a lumped capacitance that includes the parasitic capacitance of gap 18D and varactor 212-2. Ground plane G may form antenna ground. Short circuit branch 150 may form a stub that connects peripheral conductive member segment 16-1 to ground G to facilitate impedance matching between the antenna feed (formed from feed terminals 58-3 and 54-3) and antenna 40U. Short circuit branch 150 may have an associated inductance Ls.

Antenna 40U may be operable in a first high-band mode (e.g., a mode that covers band 1900 MHz) when circuit 210' is switched out of use and a second high-band mode (e.g., a mode that covers band 2100 MHz) when circuit 210' is switched into use. FIG. 7 shows one suitable circuit implementation of switchable inductor circuit 210'. As shown in FIG. 7, circuit 210 includes a switch SW and inductive element 214 coupled in series. Switch SW may be implemented using a p-i-n diode, a gallium arsenide field-effect transistor (FET), a microelectromechanical systems (MEMs) switch, a metal-oxide-semiconductor field-effect transistor (MOSFET), a high-electron mobility transistor (HEMI), a pseudomorphic HEMI (PHEMT), a transistor formed on a silicon-on-insulator (SOI) substrate, etc.

Inductive element 214 may be formed from one or more electrical components. Components that may be used as all or part of element 214 include inductors and capacitors. Desired inductances and capacitances for element 214 may be formed using integrated circuits, using discrete components (e.g., a surface mount technology inductor) and/or using dielectric and conductive structures that are not part of a discrete component or an integrated circuit. For example, capacitance can be formed by spacing two conductive pads close to each other that are separated by a dielectric, and an inductance can be formed by creating a conductive path (e.g., a transmission line) on a printed circuit board.

Figure 8:
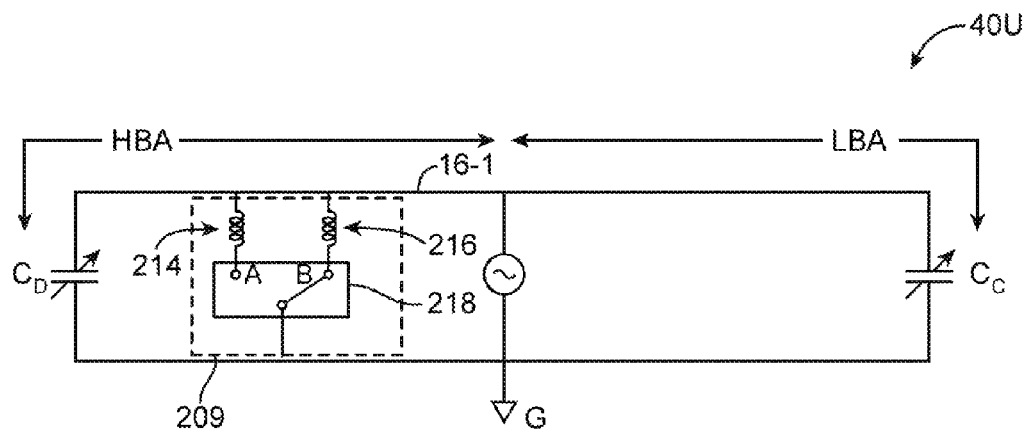

In another suitable arrangement, configurable inductor circuit 209 may be used to form a shorting path for antenna 40U (i.e., shorting structure 150 and circuit 210' of FIG. 7 are not formed). As shown in FIG. 8, circuit 209 may include inductors 214 and 216 coupled between conductive segment 16-1 and switch 218. Switch 218 may have multiple positions (shown by the illustrative A and B positions). Switch 218 may be placed in it's A position to couple inductor 214 between the antenna feeds (e.g., between positive and negative terminals 58-3 and 54-3) during the second high-band mode and may be placed in its B position to coupled inductor 216 between the antenna feeds during the first high-band mode. Inductor 216 may have an inductance value that is approximately equal to Ls (FIG. 8), as an example.

Figure 9:
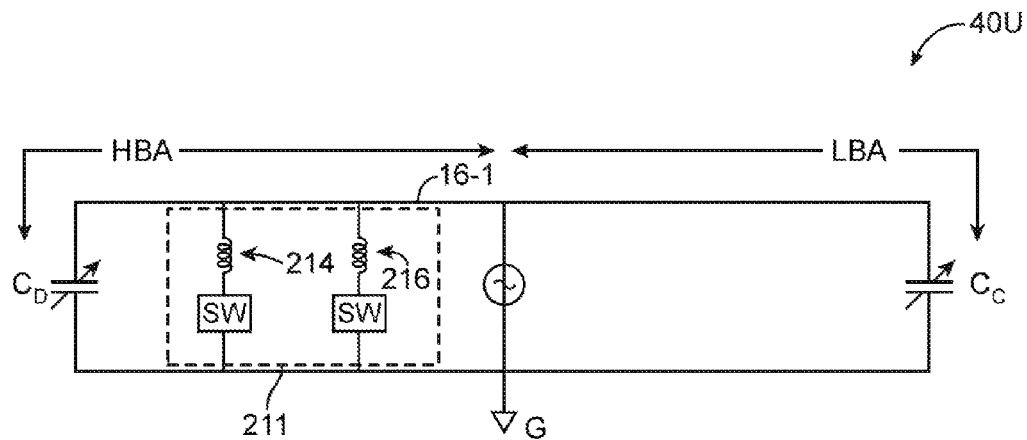

In another suitable arrangement, configurable inductor circuit 211 may be used to form a shorting path for antenna 40U (i.e., shorting structure 150 and circuit 210' of FIG. 7 are not formed). As shown in FIG. 9, circuit 211 may include inductor 214 and first switch SW coupled in series between segment 16-1 and ground G and may include inductor 216 and second switch SW coupled in series between segment 16-1 and ground G. During the first high-band mode, first switch SW may be open and second switch SW may be closed to electrically connect inductor 216 between the antenna feed terminals. During the second high-band mode, second switch SW may be disabled and first switch may be enabled to electrically connect inductor 214 between the antenna feed terminals.

FIGS. 7-9 are merely illustrative. If desired, antenna 40U may include more than two inductive branches to support wireless coverage in more than two low-band regions.

Antenna 40L may cover at least six transmit and receive communications bands (e.g., 700 MHz, 850 MHz, 900 MHz, 1800 MHz, 1900 MHz, and 2100 MHz), as shown in the table of FIG. 10. Antenna 40U may be configured to cover a subset of these six illustrative communications bands. For example, antenna 40U may be configured to cover three receive bands of interest and, with tuning, six receive bands of interest.

Antenna 40U may be configured in a first operating mode in which capacitor 212-1 is tuned to provide a first capacitance value and in which inductor circuit 210' is turned off. In the first operating mode (see, e.g., row 250 in FIG. 10), antenna 40U may be capable of covering receive bands 850 RX (the 850 MHz receive band), 900 RX (the 900 MHz receive band), 1800 RX (the 1800 MHz receive band), 1900 RX (the 1900 MHz receive band), and any other communications bands of interest.

Antenna 40U may be configured in a second operating mode in which capacitor 212-1 is tuned to provide a second capacitance value that is higher than the first capacitance value and in which inductor circuit 210' is off. In the second operating mode (see, e.g., row 252 in FIG. 10), antenna 40U may be capable of covering receive bands 750 RX (the 750 MHz receive band), 1800 RX, 1900 RX, and other communications bands of interest.

Antenna 40U may be configured in a third operating mode in which capacitor 212-1 is tuned to provide the first capacitance value and in which inductor circuit 210' is turned on. In the third operating mode (see, e.g., row 254 in FIG. 10), antenna 40U may be capable of covering receive bands 850 RX, 900 RX, 2100 RX (the 2100 MHz receive band), and other communications bands of interest.

The modes described in connection with FIG. 10 are merely illustrative. If desired, circuit 210' may be turned on/off and capacitor 212-1 may be tuned to provide suitable capacitance to cover desired high-band and low-band frequency ranges of interest. If desired, antenna 40U may also be used to transmit radio-frequency signals in the indicated bands.

Figure 11:
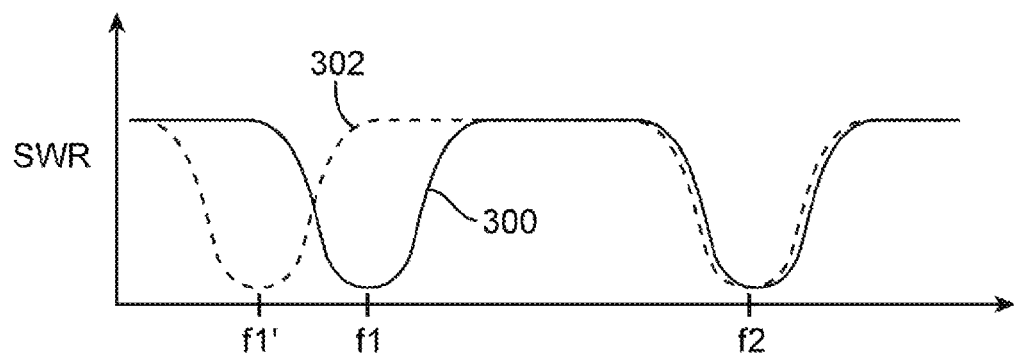
FIG. 11 is a plot showing how the upper antenna of FIG. 6 may be tuned to cover multiple low-band frequency ranges of interest in accordance with an embodiment of the present invention.

By using antenna tuning schemes of the type described in connection with FIGS. 4-10, antenna 40L and 40U may be able to cover a wider range of communications frequencies than would otherwise be possible. A standing-wave-ratio (SWR) versus frequency plot such as SWR plot of FIG. 11 illustrates low-band tuning capability for antenna 40U. As shown in FIG. 11, solid SWR frequency characteristic curve 300 corresponds to a first antenna tuning mode in which antenna 40U of device 10 exhibits satisfactory resonant peaks at low-band frequency f1 (to cover the 850 MHz band) and high-band frequency f2 (e.g., to cover the 1900 MHz band). In the first antenna tuning mode, variable capacitor circuit 212-1 may be tuned to a first capacitance, whereas switchable inductor circuit 210' is turned off.

Dotted SWR frequency characteristic curve 302 corresponds to a second antenna tuning mode in which the antennas of device 10 exhibits satisfactory resonant peaks at low-band frequency f1' (to cover the 750 MHz band) and high-band frequency f2. In the second antenna tuning mode, variable capacitor circuit 212-1 may be tuned to a second capacitance that is greater than the first capacitance to shift the wireless coverage from frequency f1 to f1'.

Figure 12:
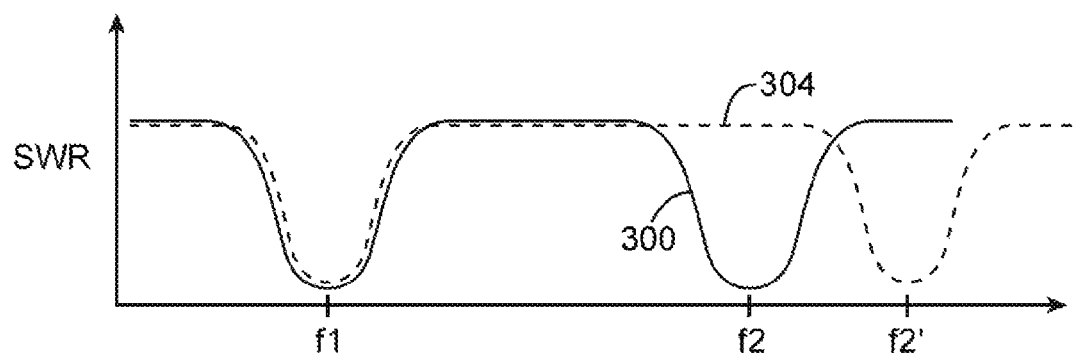
FIG. 12 is a plot showing how the upper antenna of FIG. 6 may be tuned to cover multiple high-band frequency ranges of interest in accordance with an embodiment of the present invention.

FIG. 12 illustrates antenna 40U operating in a third antenna tuning mode. As shown in FIG. 12, dotted SWR frequency characteristic curve 304 corresponds to the third antenna tuning mode in which antenna 40U exhibits satisfactory resonant peaks at low-band frequency f1 and high-band frequency f2' (to cover the 2100 MHz band). In the third antenna tuning mode, circuit 210' is switched into use to shift the wireless coverage from frequency f2 to f2'.

In general, the switchable inductor circuits described in connection with FIGS. 7-9 can be used to tune the high-band coverage for antenna 40U (e.g., the switchable inductor circuits may be configured in at least two states to provide wireless coverage in at least two high-band frequency ranges), whereas variable capacitor 212-2 may be tuned to adjust the low-band coverage for antenna 40U (e.g., the variable capacitor associated with low-band gap 18C may be tuned to provide wireless coverage in at least two low-band frequency ranges). FIGS. 11 and 12 are merely illustrative. If desired, antennas 40L, 40U, and 40WF may include antenna tuning circuitry that enables device 10 to transmit and receive wireless signals at any suitable number of radio-frequency communications bands.

The foregoing is merely illustrative of the principles of this invention and various modifications can be made by those skilled in the art without departing from the scope and spirit of the invention.

What is claimed is:

1. An electronic device comprising:
    a housing having a conductive member that runs around a periphery of the housing;
    an inverted-F antenna that is formed from an antenna ground and a portion of the conductive member, wherein the inverted-F antenna is configured to operate in a low-band frequency range centered at a first frequency and a high-band frequency range centered at a second frequency that is greater than the first frequency; and
    a switchable inductor coupled between the antenna ground and the portion of the peripheral conductive member, wherein the switchable inductor is configured to center the high-band frequency range at a third frequency that is greater than the first and second frequencies while the inverted-F antenna maintains operation in the low-band frequency range centered at the first frequency.

2. The electronic device defined in claim 1, wherein the conductive member comprises at least one gap that divides the conductive member into a plurality of segments and wherein the portion includes at least one of the plurality of segments.

3. The electronic device defined in claim 2, wherein the antenna ground includes conductive housing structures formed within the electronic device.

4. The electronic device defined in claim 3, wherein the conductive housing structures comprises a printed circuit board.

5. The electronic device defined in claim 2, wherein the inverted-F antenna comprises first and second antenna feed terminals and wherein the switchable inductor is coupled between the first and second antenna feed terminals.

6. The electronic device defined in claim 5, wherein the switchable inductor comprises an inductor and a switch that are connected in series between the first and second antenna feed terminals.

7. The electronic device defined in claim 6, further comprising:
    wireless transceiver circuitry, wherein the wireless transceiver circuitry is coupled to the first antenna feed terminal.

8. The electronic device defined in claim 7, further comprising:
    a conductive path coupled in parallel with the switchable inductor between the first and second antenna feed terminals.

9. The electronic device defined in claim 8, further comprising:
    a variable capacitor circuit that bridges the at least one gap in the conductive member.

10. A wireless electronic device comprising:
    a housing containing conductive structures that form an antenna ground and having a conductive member that runs around a periphery of the housing;
    an antenna that is formed from the antenna ground and a portion of the conductive member; and
    a switchable inductor circuit coupled between the antenna ground and the portion of the conductive member, wherein:
        when the switchable inductor circuit is switched out of use, the antenna is configured to operate in a low-band frequency range and in a first high-band frequency range; and when the switchable inductor circuit is switched into use, the antenna is configured to operate in the low-band frequency range and is configured to maintain operation in a second high-band frequency range that is higher in frequency than the first high-band frequency range.

11. The wireless electronic device defined in claim 10, wherein the antenna comprises first and second antenna feed terminals and wherein the switchable inductor circuit is coupled between the first and second antenna feed terminals, further comprising:
    wireless transceiver circuitry coupled to the first antenna feed terminal.

12. The wireless electronic device defined in claim 11, wherein the antenna comprises an inverted-F antenna.

13. The wireless electronic device defined in claim 12, wherein the conductive member has at least two gaps, further comprising:
    a variable capacitor circuit that bridges one of the two gaps.

14. The wireless electronic device defined in claim 12, wherein the switchable inductor circuit comprises an inductor and a switch that are connected in series between the first and second antenna feed terminals.

15. The wireless electronic device defined in claim 12, wherein the switchable inductor circuit comprises:
    a switch;
    a first inductor, wherein the first inductor and the switch are coupled in series between the first and second antenna feed terminals; and
    a second inductor, wherein the second inductor and the switch are coupled in series between the first and second antenna feed terminals.

16. The wireless electronic device defined in claim 12, wherein the switchable inductor circuit comprises:
    first and second switches;
    a first inductor, wherein the first inductor and the first switch are coupled in series between the first and second antenna feed terminals; and
    a second inductor, wherein the second inductor and the second switch are coupled in series between the first and second antenna feed terminals.

17. A wireless electronic device comprising:
    a housing having a periphery;
    a conductive structure that runs along the periphery and that has at least two gaps on the periphery; and
    an inverted-F antenna formed at least partly from an antenna ground and a portion of the conductive structure;
    a switchable inductor coupled between the antenna ground and the portion of the conductive structure; and
    a variable capacitor that bridges at least one of the two gaps in the conductive structure that runs along the periphery, wherein:
    when the variable capacitor is tuned to provide a first capacitance, the inverted-F antenna is configured to operate in a first low-band frequency range and in a first high-band frequency range; and
    when the variable capacitor is tuned to provide a second capacitance that is different than the first capacitance and the switchable inductor is switched into use, the inverted-F antenna is configured to operate in a second low-band frequency range that is lower in frequency than the first low-band frequency range and is configured to operate in a second high-band frequency range that is higher than the first high-band frequency range.

18. The wireless electronic device defined in claim 17, wherein the inverted-F antenna comprises first and second antenna feed terminals, further comprising:
    wireless transceiver circuitry coupled to the first antenna feed terminal.

19. The wireless electronic device defined in claim 18, further comprising:
    the switchable inductor coupled between the first and second antenna feed terminals.

20. The wireless electronic device defined in claim 19, wherein the switchable inductor comprises an inductor and a switch that are coupled in series between the first and second antenna feed terminals.

21. The wireless electronic device defined in claim 20, further comprising a conductive shorting path coupled in parallel with the switchable inductor between the first and second antenna feed terminals.

22. The wireless electronic device defined in claim 17, further comprising:
    processing circuitry, wherein the processing circuitry generates control signals that tunes the variable capacitor to provide the first and second capacitance.

* * * * *